US012765329B2

(12) United States Patent
Roh et al.

(10) Patent No.: US 12,765,329 B2
(45) Date of Patent: Oct. 13, 2026

(54) SEMICONDUCTOR CHIP, SEMICONDUCTOR DEVICE INCLUDING SEMICONDUCTOR CHIPS, AND METHOD OF INSPECTING THE SEMICONDUCTOR DEVICE

(71) Applicant: Samsung Electronics Co., Ltd., Suwon-si (KR)

(72) Inventors: Junghyun Roh, Suwon-si (KR); Honggyun Kim, Suwon-si (KR); Manhee Han, Suwon-si (KR); Jaeyoung Hong, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 257 days.

(21) Appl. No.: 18/635,180

(22) Filed: Apr. 15, 2024

(65) Prior Publication Data

US 2025/0022760 A1 Jan. 16, 2025

(30) Foreign Application Priority Data

Jul. 12, 2023 (KR) ........................ 10-2023-0090150

(51) Int. Cl.
*H10P 74/00* (2026.01)

(52) U.S. Cl.
CPC .................................. *H10P 74/277* (2026.01)

(58) Field of Classification Search
CPC .......... H10P 54/00; H10P 74/00; H10P 74/23; H10P 74/277; H10P 72/0436; H10W 42/00; B23K 26/03; B23K 26/0626; B23K 26/073; B23K 26/08; B23K 2101/40
See application file for complete search history.

(56) References Cited

U.S. PATENT DOCUMENTS

| | | | | |
|---|---|---|---|---|
| 7,576,852 | B2 | 8/2009 | Nabeshima et al. | |
| 10,262,899 | B2 | 4/2019 | Lu et al. | |
| 2003/0174878 | A1 * | 9/2003 | Levin | G01N 21/95607 382/149 |
| 2008/0220590 | A1 * | 9/2008 | Miller | B23K 26/03 257/E21.001 |
| 2013/0087948 | A1 * | 4/2013 | Kitahara | B23K 26/18 264/400 |

FOREIGN PATENT DOCUMENTS

| | | | |
|---|---|---|---|
| CN | 114864547 | A | 8/2022 |
| JP | 4733154 | B2 | 7/2011 |
| KR | 2019-0032190 | A | 3/2019 |
| KR | 2021-0127610 | A | 10/2021 |
| KR | 2022-0003962 | A | 1/2022 |

* cited by examiner

*Primary Examiner* — Brook Kebede
(74) *Attorney, Agent, or Firm* — Harness, Dickey & Pierce, P.L.C.

(57) ABSTRACT

A semiconductor chip includes a semiconductor substrate having a first surface and a second surface opposite to the first surface. The semiconductor substrate includes a circuit pattern region and a peripheral region surrounding the circuit pattern region, an activation layer on the second surface of the semiconductor substrate and having a plurality of circuit patterns in the circuit pattern region, and at least one scattering detection pattern in the peripheral region and having a plurality of circuit cells that generate leakage current based on a scattered beam or heat of a laser.

20 Claims, 11 Drawing Sheets

300

300

300

300

SEMICONDUCTOR CHIP, SEMICONDUCTOR DEVICE INCLUDING SEMICONDUCTOR CHIPS, AND METHOD OF INSPECTING THE SEMICONDUCTOR DEVICE

PRIORITY STATEMENT

This application claims priority under 35 U.S.C. § 119 to Korean Patent Application No. 10-2023-0090150, filed on Jul. 12, 2023 in the Korean Intellectual Property Office (KIPO), the contents of which are herein incorporated by reference in their entirety.

BACKGROUND

1. Field

The present disclosure relates to semiconductor chips, semiconductor devices including a plurality of semiconductor chips and methods of inspecting the semiconductor devices. More particularly, the present disclosure relates to semiconductor chips manufactured by a laser process, semiconductor devices having a plurality of semiconductor chips, and methods for inspecting the semiconductor devices.

2. Description of the Related Art

A semiconductor device such as a semiconductor wafer may be individualized into a plurality of semiconductor chips through a dicing process. In the dicing process, a laser moves along a scribe lane region of the semiconductor wafer and may cut the semiconductor wafer. Laser scattering may occur during the process of cutting the semiconductor wafer using the laser. Laser scattering may cause damage to circuit elements inside a semiconductor chip. Scattering energy generated from laser scattering may result in a problem of deteriorating the operating characteristics of the semiconductor chips.

SUMMARY

Some example embodiments of the inventive concepts provide a semiconductor chip including a scattering detection pattern having a plurality of circuit cells that measure laser scattering.

Some example embodiments of the inventive concepts provide a semiconductor device including the semiconductor chip.

Some example embodiments of the inventive concepts provide a method of inspecting the semiconductor device.

Embodiments of the inventive concepts provide a semiconductor chip that includes a semiconductor substrate having a first surface and a second surface opposite to the first surface, the semiconductor substrate including a circuit pattern region and a peripheral region surrounding the circuit pattern region; an activation layer on the second surface of the semiconductor substrate, the activation layer having a plurality of circuit patterns in the circuit pattern region; and at least one scattering detection pattern in the peripheral region, the at least one scattering detection pattern having a plurality of circuit cells that generate leakage current based on a scattered beam or heat of a laser.

Embodiments of the inventive concepts further provide a semiconductor device that includes a silicon substrate having a first surface and a second surface opposite to the first surface, the silicon substrate including a plurality of circuit pattern regions and a peripheral region between the circuit pattern regions; an activation layer on the second surface of the silicon substrate, the activation layer having a plurality of circuit patterns respectively in the circuit pattern regions; and a plurality of scattering detection patterns in the peripheral region, each of the plurality of scattering detection patterns having a plurality of circuit cells that generate leakage current based on a scattered beam or heat of a laser.

Embodiments of the inventive concepts still further provide a method of inspecting a semiconductor device. The method includes providing a silicon substrate having a plurality of circuit pattern regions and a scribe lane region between the circuit pattern regions is provided. The silicon substrate is cut along the scribe lane region using a laser. Laser scattering data is obtained from a plurality of scattering detection patterns that are provided adjacent to the scribe lane region, the plurality of scattering detection patterns generating leakage current based on a scattered beam generated by the laser. The laser scattering data is stored.

According to some example embodiments, a semiconductor chip may include a semiconductor substrate having a first surface and a second surface opposite to the first surface, and including a circuit pattern region and a peripheral region surrounding the circuit pattern region; an activation layer on the second surface of the semiconductor substrate and having a plurality of circuit patterns in the circuit pattern region; and at least one scattering detection pattern in the peripheral region and including having a plurality of circuit cells that generate leakage current based on a scattered beam or heat of a laser.

Accordingly, the semiconductor chip may be individualized by cutting a semiconductor wafer along the scribe lane region by a dicing process. The dicing process may be performed while moving the laser along the scribe lane region.

Among the plurality of circuit cells, a circuit cell that generates the leakage current may be a circuit cell deformed by the scattered beam or the heat. The scattering detection pattern having the plurality of circuit cells may measure laser scattering generated from the laser based on the deformed circuit cell. The laser scattering may be stored as data during a function test.

Through the data of the laser scattering, the degree of laser scattering of the semiconductor equipment for performing the dicing process may be confirmed. Through the degree of laser scattering, a warning control system for the semiconductor facility may be installed and quality degradation resulting from the laser scattering may be limited and/or prevented.

Further, the scattering detection pattern may be provided in the peripheral region. Since the circuit patterns are not provided in the peripheral region, the scattering detection pattern may not affect the performance of the semiconductor chip.

BRIEF DESCRIPTION OF THE DRAWINGS

Example embodiments will be more clearly understood from the following detailed description taken in conjunction with the accompanying drawings.

FIG. 1 is a plan view illustrating a semiconductor device in accordance with some example embodiments of the inventive concepts.

FIG. 2 is a cross-sectional view taken along the line A-A' in FIG. 1.

FIG. 3 is an enlarged plan view illustrating portion 'B' in FIG. 1.

FIG. 4 is a view illustrating a scattering detection pattern having a plurality of circuit cells.

FIG. 5 is an enlarged plan view illustrating portion 'C' in FIG. 3.

FIG. 6 is an enlarged plan view illustrating portion 'D' in FIG. 3.

FIG. 7 is an enlarged plan view illustrating portion 'E' in FIG. 3.

FIGS. 8, 9, 10, 11 and 12 are views illustrating a method of inspecting a semiconductor device in accordance with some example embodiments of the inventive concepts.

DETAILED DESCRIPTION

Hereinafter, example embodiments will be explained in detail with reference to the accompanying drawings.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

Figure 1:
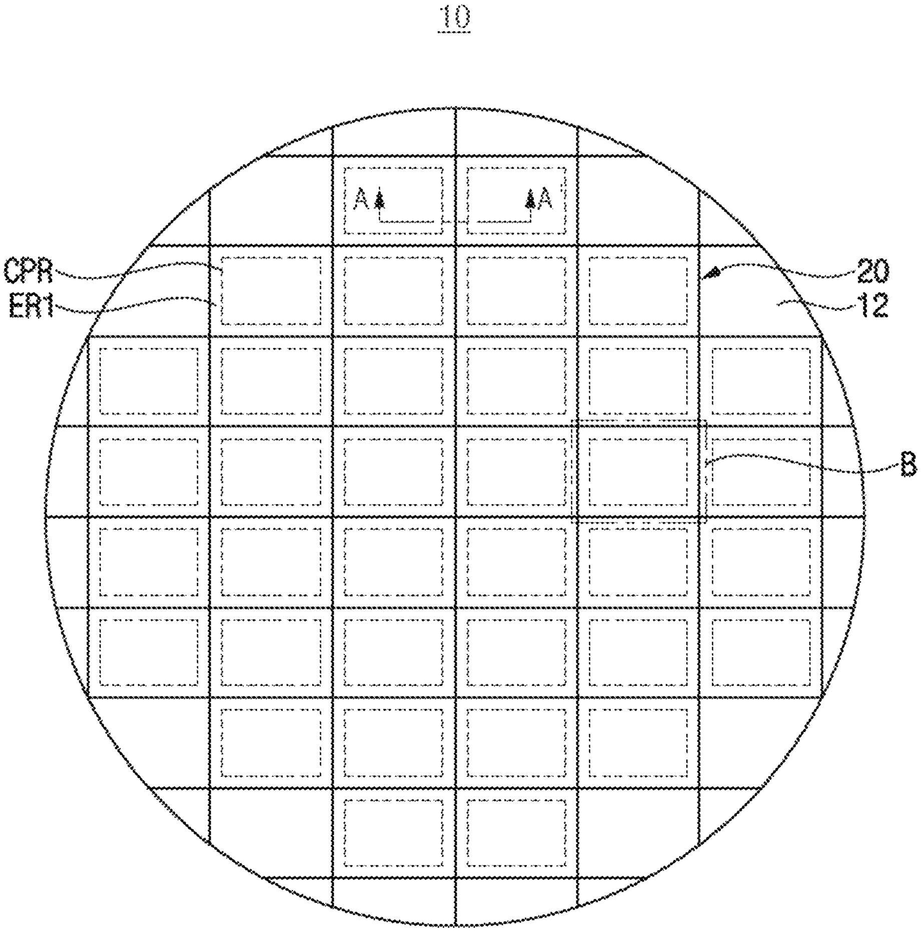
FIGS. 1 to 12 represent non-limiting, example embodiments as described herein.
Figure 2:
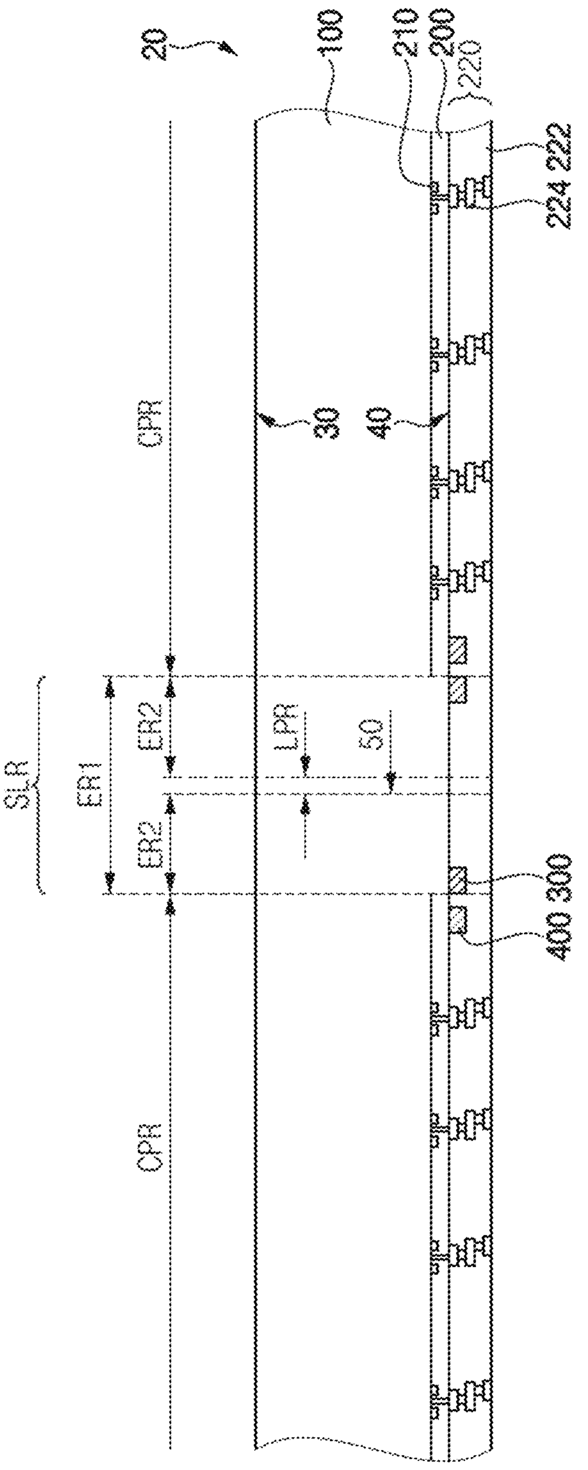
Figure 3:
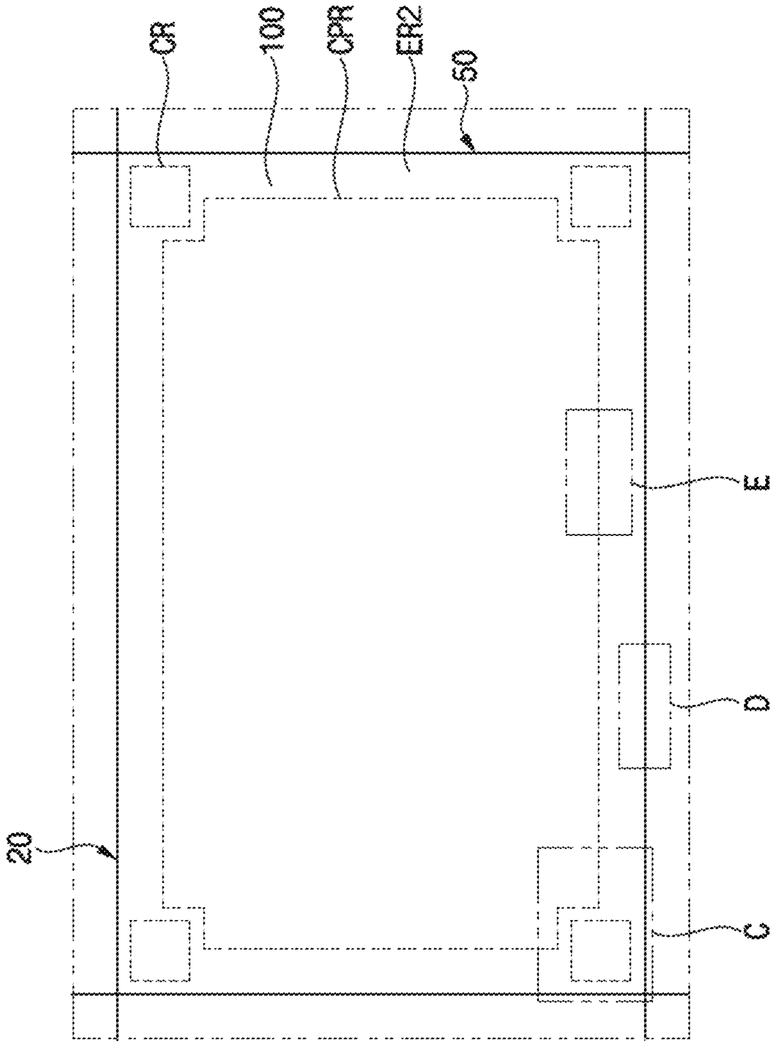
Figure 4:
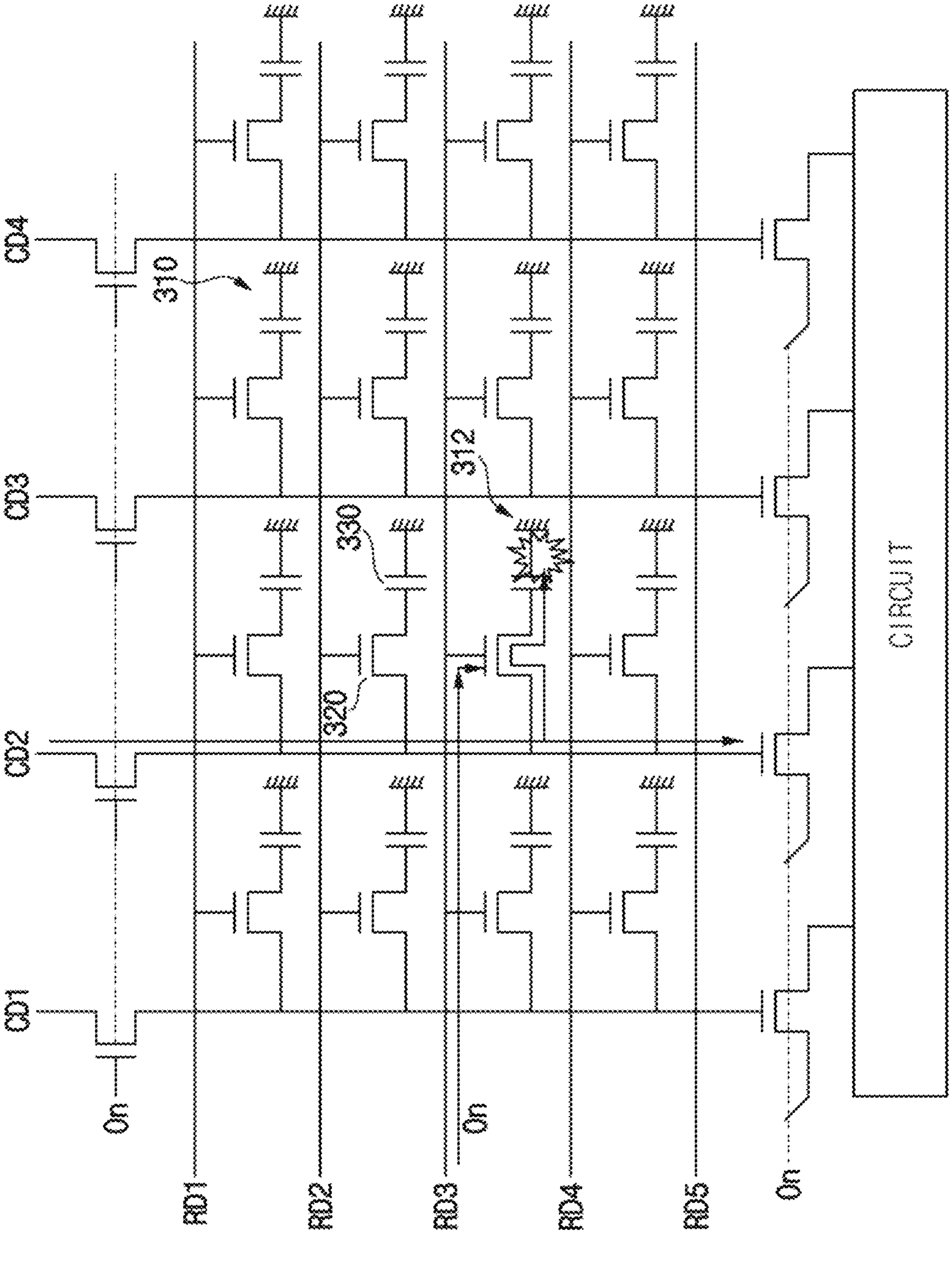
Figure 5:
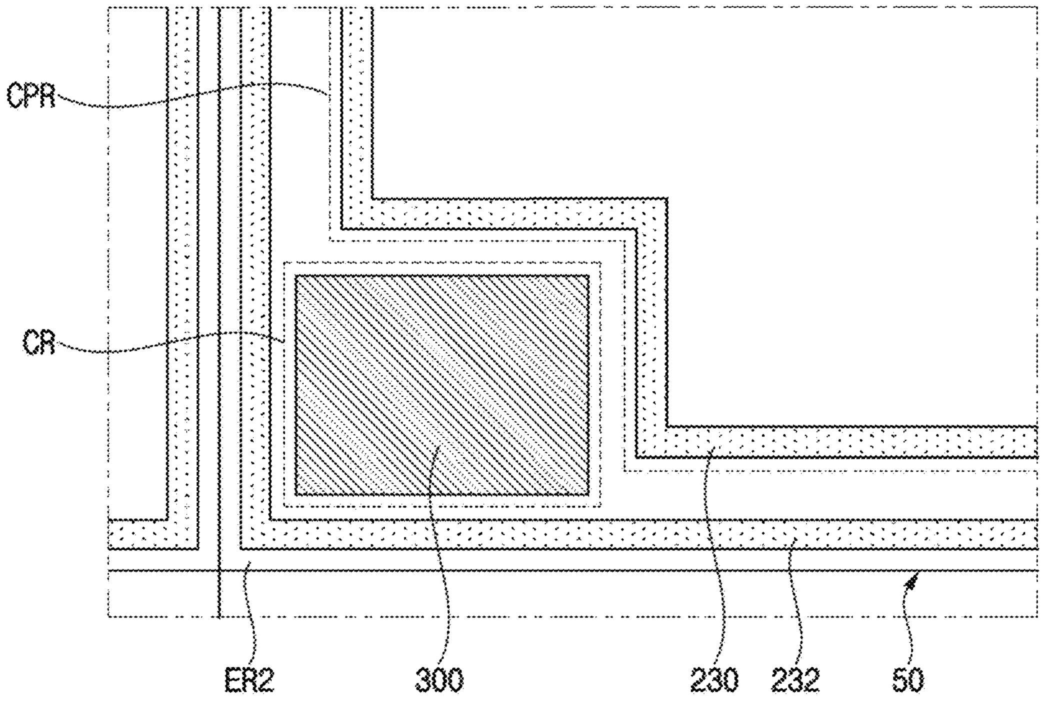
Figure 6:
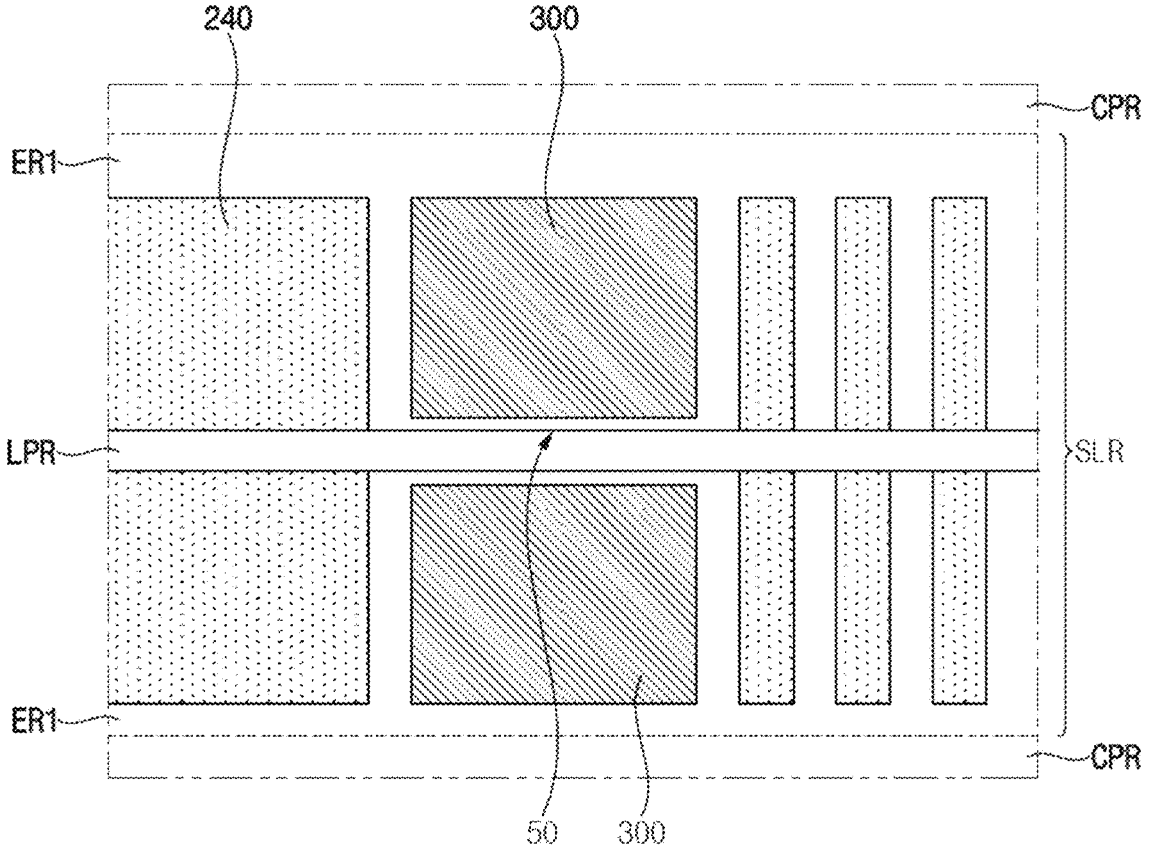
Figure 7:
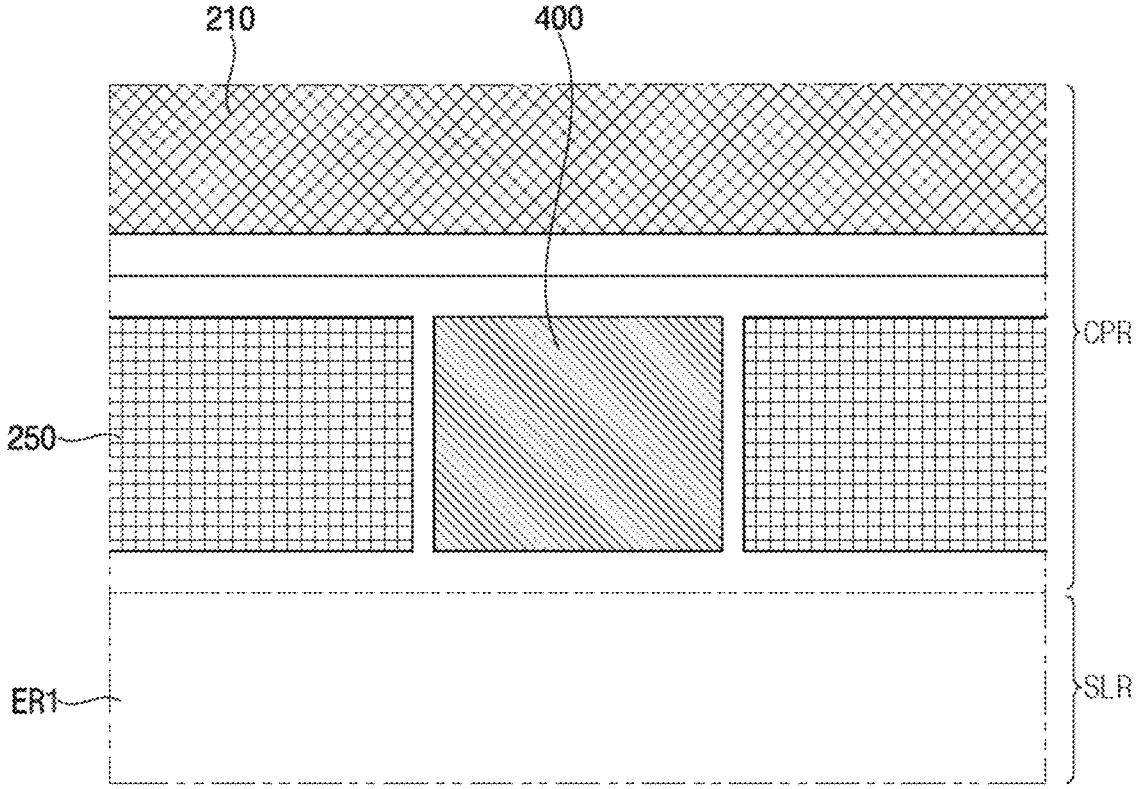

FIG. 1 is a plan view illustrating a semiconductor device in accordance with some example embodiments. FIG. 2 is a cross-sectional view taken along the line A-A' in FIG. 1. FIG. 3 is an enlarged plan view illustrating portion 'B' in FIG. 1. FIG. 4 is a view illustrating a scattering detection pattern having a plurality of circuit cells. FIG. 5 is an enlarged plan view illustrating portion 'C' in FIG. 3. FIG. 6 is an enlarged plan view illustrating portion 'D' in FIG. 3. FIG. 7 is an enlarged plan view illustrating portion 'E' in FIG. 3.

Referring to FIGS. 1 to 7, a semiconductor device 10 may include a plurality of semiconductor chips 20. The semiconductor device 10 may be individually separated into a plurality of semiconductor chips 20 by a dicing process.

The dicing process may be a process for individualizing the semiconductor device 10 into the plurality of semiconductor chips 20 through a laser processing apparatus using a laser. The dicing process may be a process for cutting the semiconductor device 10 such as a semiconductor wafer, which is placed in a chamber through laser processing technology. In the dicing process, the laser may move along a scribe lane region SLR and may cut the semiconductor device 10.

The plurality of semiconductor chips 20 may be arranged in a grid shape. During the dicing process, the laser may move between the plurality of semiconductor chips 20. During the dicing process, the laser may individualize the plurality of semiconductor chips 20 by moving between the semiconductor chips 20 arranged in the grid shape. In the process of irradiating the laser onto the semiconductor device 10, the laser may generate a scattered beam or heat.

In some example embodiments, the laser may include a conventional laser, a stealth laser, etc. The conventional laser may collide with the surface of the semiconductor device 10 to generate heat. The conventional laser may cut the semiconductor device by generating a groove in the surface of the semiconductor substrate 100 using the heat.

For example, in the process of cutting the semiconductor device 10, the stealth laser may generate the scattered beam, and the conventional laser may generate the heat. The heat may cause thermal damages to the semiconductor device 10.

The stealth laser may concentrate light inside the semiconductor device 10 to form a modified layer. An external force may be applied to the semiconductor device 10 on which the modified layer is formed, and the modified layer of the semiconductor device 10 may be separated by the external force. The semiconductor device 10 may be separated into a plurality of semiconductor chips 20 along the modified layer. The stealth laser may reduce residue generated from the semiconductor device 10. Since the stealth laser has a narrow kerf, the number of the semiconductor chips 20 that can be obtained from one semiconductor device 10 may be increased.

In the dicing process, the laser may pass through a solid medium and be irradiated onto the semiconductor device 10. As the laser passes through the solid medium, properties of the laser may change. For example, the solid medium may be neodymium yttrium aluminum garnet compound (Nd:YAG), neodymium yttrium orthovanadate compound (Nd:YVO4), aluminum gallium arsenide compound (AlGaAS), aluminum gallium indium compound (AlGaInP), gallium nitride compound (GaN), neodymium optical fiber (Nd-Fiber), sapphire, etc.

The semiconductor device 10 may include a silicon substrate 12 having first and second surfaces 30 and 40 opposite to each other. The first surface 30 of the silicon substrate 12 may be a backside surface, and the second surface 40 may be a front surface.

The silicon substrate 12 may have a circuit pattern region CPR and a first peripheral region ER1 surrounding the circuit pattern region CPR. The circuit pattern region CPR may be a region where circuit patterns 210 are provided. The first peripheral region ER1 may include all areas on the semiconductor substrate 100 where the circuit patterns 210 are not provided. For example, the first peripheral region ER1 may include the scribe lane region.

The first peripheral region ER1 may have a first width and may extend between the circuit pattern regions CPR. For example, the first width of the first peripheral region ER1 may be within a range of about 60 μm to 80 μm.

For example, the silicon substrate 12 may include a semiconductor material such as silicon, germanium, silicon-germanium, etc. The silicon substrate 12 may include III-V compounds such as gallium phosphide (GaP), gallium arsenide (GaAs), gallium antimonide (GaSb), etc. The silicon substrate 12 may include a silicon-on-insulator (SOI) substrate, a germanium-on-insulator (GOI) substrate, etc.

In some example embodiments, the semiconductor chip 20 may include a semiconductor substrate 100 having first and second surfaces 30 and 40 opposite to each other, an activation layer 200 provided on the second surface 40 of the semiconductor substrate 100 and having a plurality of circuit patterns 210, a wiring layer 220 provided on the activation layer 200 and wirings 224 electrically connected to the plurality of circuit patterns 210, and at least one first scattering detection pattern 300 having a plurality of circuit cells 310 that are able to generate leakage current by, and/or based on, the laser.

The semiconductor substrate 100 may be formed by cutting the silicon substrate 12 through the dicing process.

The semiconductor substrate 100 may have a circuit pattern region CPR and a second peripheral region ER2 surrounding the circuit pattern region CPR. The second peripheral region ER2 may be formed by cutting the first peripheral region ER1 of the silicon substrate 12 through the dicing process. Accordingly, the first peripheral region ER1 may include the second peripheral region ER2.

The circuit pattern region CPR may be an area where the circuit patterns 210 of the activation layer 200 are provided. The second peripheral region ER2 may include all areas on the semiconductor substrate 100 where the circuit patterns 210 are not provided. The second peripheral region ER2 may have a second width and may extend along the periphery of the circuit pattern region CPR. For example, the second width of the second peripheral region ER2 may be within a range of about 30 μm to 40 μm.

The second peripheral region ER2 may include chamfer regions CR. The chamfer regions CR may be provided adjacent to corners of the semiconductor chip 20. The chamfer regions CR may be provided adjacent to corners of the circuit pattern region CPR.

In some example embodiments, the activation layer 200 may be provided on the second surface 40 of the semiconductor substrate 100. The activation layer 200 may include a circuit layer therein. The circuit layer may include the plurality of circuit patterns 210 therein. The circuit pattern 210 may include transistors, diodes, etc. The circuit pattern 210 may be formed on the second surface 40 of the semiconductor substrate 100 through a wafer process called front-end-of-line (FEOL).

The activation layer 200 may vary depending on the type of semiconductor chip 20. For example, the activation layer 200 may include an application processor (AP). The activation layer 200 may include static random access memory (SRAM), dynamic random access memory (DRAM), NAND flash memory, silicon carbide circuits (SiC circuits), etc.

The wiring layer 220 may be provided on the second surface 40 of the semiconductor substrate 100. The wiring layer 220 may be formed on the second surface 40 of the semiconductor substrate 100 through a wiring process called back-end-of-line (BEOL). The wiring layer 220 may include a plurality of insulating layers 222 and wirings 224 provided in the insulating layers 222. For example, the insulating layer 222 may include a polymer, a dielectric layer, etc. For example, the insulating layer 222 may include polyimide (PI), lead oxide (PbO), polyhydroxystyrene (PHS), NOVOLAC® (industrial grade epoxy), etc. The insulating layer 222 may be formed by a vapor deposition process, spin coating process, etc.

The wiring 224 may be formed by forming a seed layer on a portion of the insulating layer 222 and in an opening of the insulating layer 222, patterning the seed layer and performing an electrolytic plating process. Accordingly, at least a portion of the wiring 224 may directly contact the wiring of another layer through the opening. At least a portion of the wiring 224 may be electrically connected to the circuit pattern 210. For example, the wiring 224 may include aluminum (Al), copper (Cu), tin (Sn), nickel (Ni), gold (Au), platinum (Pt), or an alloy thereof.

In some example embodiments, the first scattering detection pattern 300 may include the plurality of circuit cells 310 that are deformed by the heat or the scattered beam of the laser. The plurality of circuit cells 310 may be exposed to the scattered beam or the heat to generate the leakage current. The first scattering detection pattern 300 may be provided in the second peripheral region ER2.

The first scattering detection pattern 300 may detect the scattered beam or the heat generated in the dicing process. The scattered beam or the heat may be generated when the laser cuts the silicon substrate 12 of the semiconductor device 10 and may affect the circuit pattern 210 of the activation layer 200.

As illustrated in FIG. 4, the first scattering detection pattern 300 includes a plurality of row decks RD1, RD2, RD3, RD4, RD5 extending parallel to each other in a first horizontal direction, and a plurality of codecs (Co Dec) CD1, CD2, CD3, CD4, CD5 extending parallel to each other in a second horizontal direction perpendicular to the first horizontal direction.

The plurality of circuit cells 310 may be arranged in a grid shape on the second surface 40 of the semiconductor substrate 100. The plurality of circuit cells 310 may be formed as individual units by the plurality of row decks RD1, RD2, RD3, RD4, RD5 and the plurality of codecs CD1, CD2, CD3, CD4, CD5.

At least one of the plurality of circuit cells 310 may be deformed by the scattered beam or the heat. The first scattering detection pattern 300 may obtain a coordinate value of a position where the scattered beam or the heat arrives through the plurality of circuit cells 310 arranged in the grid shape.

The plurality of circuit cells 310 may include a plurality of transistors 320 and a plurality of capacitors 330. Current may be applied selectively to the plurality of row decks RD1, RD2, RD3, RD4, RD5 and the plurality of codecs CD1, CD2, CD3, CD4, CD5 to turn on/off the plurality of transistors 320. The plurality of capacitors 330 may be charged to a preset voltage.

When the plurality of transistors 320 are independently turned on while the plurality of capacitors 330 are charged, the plurality of circuit cells 310 may generate a first potential difference. Among the plurality of circuit cells 310, a circuit cell 312 deformed by the scattered beam or the heat may generate a second potential difference different from the first potential difference. The circuit cell 312 that generates the second potential difference may be the circuit cell in which leakage current occurs. The first scattering detection pattern 300 may have (e.g., or indicate) the coordinate value of the circuit cell 312 where the leakage current occurs.

In some example embodiments, the first scattering detection pattern 300 may be disposed at a desired position in the second peripheral region ER2 where the circuit patterns 210 are not provided.

As illustrated in FIG. 5, the first scattering detection pattern 300 may be provided in the chamfered region CR within the second peripheral region ER2. The chamfer region may be an area in which cracks of the semiconductor chip 20 frequently occur. Because the frequency of occurrence of cracks in the chamfered region is relatively high, the circuit pattern 210 may not be provided in the chamfered region.

The chamfer region may be provided adjacent to a chip guard 230 that is configured to protect the circuit pattern 210. The chamfer region CR may be provided adjacent to a dam 232 that extends along the periphery of the semiconductor chip 20. The chamfer region may be provided between the chip guard 230 and the dam 232.

As illustrated in FIG. 6, the first scattering detection pattern 300 may be provided in the first peripheral region ER1. The first peripheral region ER1 may have the scribe lane region. A plurality of alignment keys 240 may be provided in the scribe lane region. The plurality of alignment keys 240 may be used to align the semiconductor device 10 to a preset position during the semiconductor manufacturing process. The first scattering detection pattern 300 may be provided between the plurality of alignment keys 240.

The scribe lane region may have a laser pass region LPR along which the laser moves. The laser moves along the laser pass region LPR in the scribe lane region and may individualize the semiconductor device 10 into a plurality of semiconductor chips 20. As the laser moves along the laser pass region LPR, an outer surface 50 of the semiconductor substrate 100 may be formed. For example, the outer surface 50 may be an outer side surface of the semiconductor substrate 100.

The first scattering detection pattern 300 may be provided in the scribe lane region. The first scattering detection pattern 300 may be provided adjacent to the laser pass region LPR in the semiconductor device 10. The first scattering detection pattern 300 may be provided adjacent to the outer surface 50 of the semiconductor substrate 100.

In some example embodiments, the semiconductor chip 20 may further include at least one second scattering detection pattern 400 provided in the circuit pattern region CPR.

As illustrated in FIG. 7, the plurality of circuit patterns 210 may include a decoupling capacitor 250. The decoupling capacitor 250 may be provided adjacent to the first peripheral region ER1 within the circuit pattern region CPR. The decoupling capacitor 250 may be provided to surround a sub word line driver (SWD) of the circuit patterns 210.

The decoupling capacitor 250 may limit and/or prevent decoupling of the semiconductor chip 20. The decoupling capacitor 250 may increase the stability of an initial voltage of the semiconductor chip 20. The decoupling capacitor 250 may suppress frequency noise (AC signal) of a power supply signal.

The second scattering detection pattern 400 may be provided adjacent to the decoupling capacitor 250. The second scattering detection pattern 400 may include at least one second scattering detection pattern having a plurality of second circuit cells that are deformed by the scattering beam or the heat. The plurality of second circuit cells may be able to generate leakage current by the scattered beam or the heat. The second scattering detection pattern 400 may perform the same or substantially the same function as the first scattering detection pattern 300 through the plurality of second circuit cells.

As mentioned above, the semiconductor chip 20 may be individualized by cutting the semiconductor device 10 along the scribe lane region through the dicing process. The dicing process may be performed while moving the laser along the scribe lane region.

Among the plurality of circuit cells 310, a circuit cell that generates the leakage current may be a circuit cell deformed by the scattered beam or the heat. The first scattering detection pattern 300 having the plurality of circuit cells 310 may measure laser scattering generated from the laser based on the deformed circuit cell. The laser scattering may be stored as data during a function test.

Through the data of the laser scattering, the degree of laser scattering of the semiconductor equipment for performing the dicing process may be confirmed. Through the degree of laser scattering, a warning control system for the semiconductor facility may be installed and quality degradation resulting from the laser scattering may be limited and/or prevented.

The first scattering detection pattern 300 may be provided in the first peripheral region ER1. Since the circuit patterns 210 are not provided in the first peripheral region ER1, the first scattering detection pattern 300 may not affect the performance of the semiconductor chip 20.

Hereinafter, a method for inspecting the semiconductor device of FIG. 1 will be described.

Figure 8:
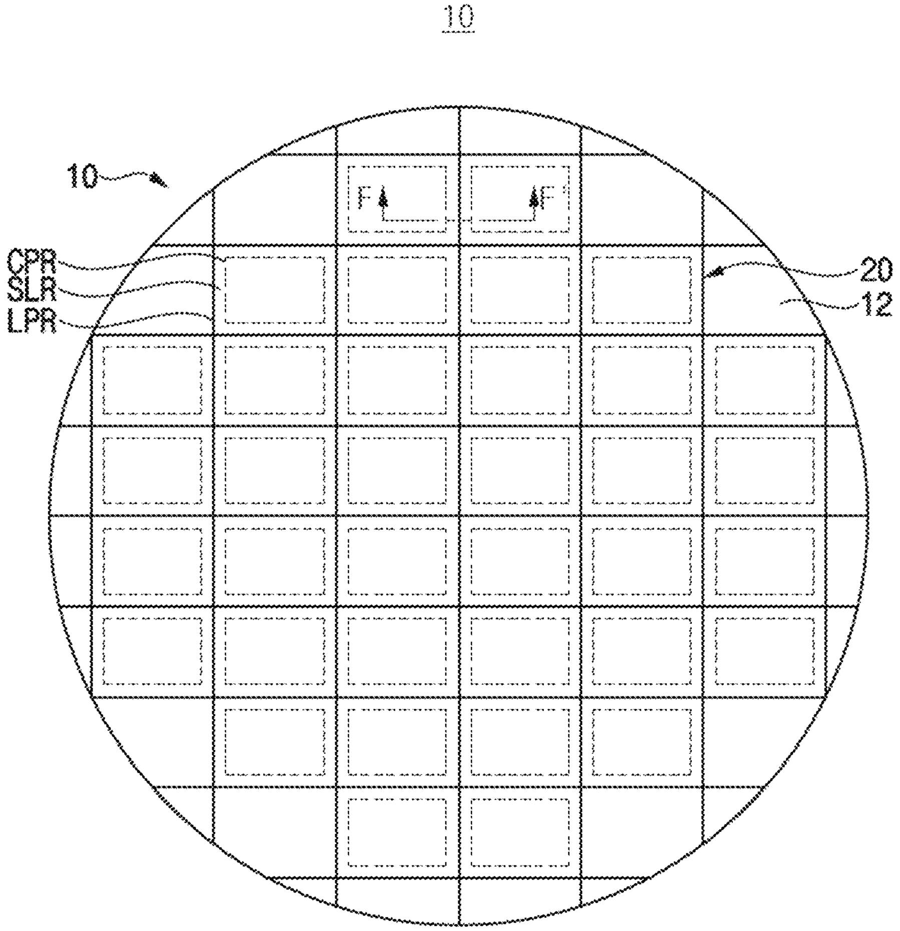

FIGS. 8 to 12 are views illustrating a method of inspecting a semiconductor device in accordance with some example embodiments of the inventive concepts. FIG. 8 is a plan view illustrating a semiconductor device in accordance with some example embodiments.

Referring to FIG. 8, first, a silicon substrate 12 having a plurality of circuit pattern regions CPR and a scribe lane region SLR provided between the circuit pattern regions CPR may be provided.

In some example embodiments, the silicon substrate 12 may have the plurality of circuit pattern regions CPR and the scribe lane region SLR provided between the circuit pattern regions CPR. The circuit pattern region CPR may be an area where circuit patterns 210 are provided. The scribe lane region SLR may include all areas on the silicon substrate 12 where the circuit patterns 210 are not provided. The scribe lane region SLR may have a laser pass region LPR along which a laser L moves.

The silicon substrate 12 may include a plurality of scattering detection patterns 300 that are provided in the scribe lane region SLR. The scattering detection pattern 300 may include a plurality of circuit cells 310 that are deformed by heat or a scattered beam of the laser L.

The plurality of scattering detection patterns 300 may be provided in chamfer regions adjacent to the circuit pattern region CPR in the scribe lane region. The chamfer region CR may be a corner area where cracks are likely to occur.

The plurality of scattering detection patterns 300 may be provided adjacent to the laser pass region LPR in the scribe lane region SLR. The plurality of scattering detection patterns 300 may be provided between a plurality of alignment keys that are configured to align the silicon substrate 12 to a preset position during the semiconductor manufacturing process. The plurality of scattering detection patterns 300 may be provided between decoupling capacitors 250 in the circuit pattern regions CPR.

Figure 9:
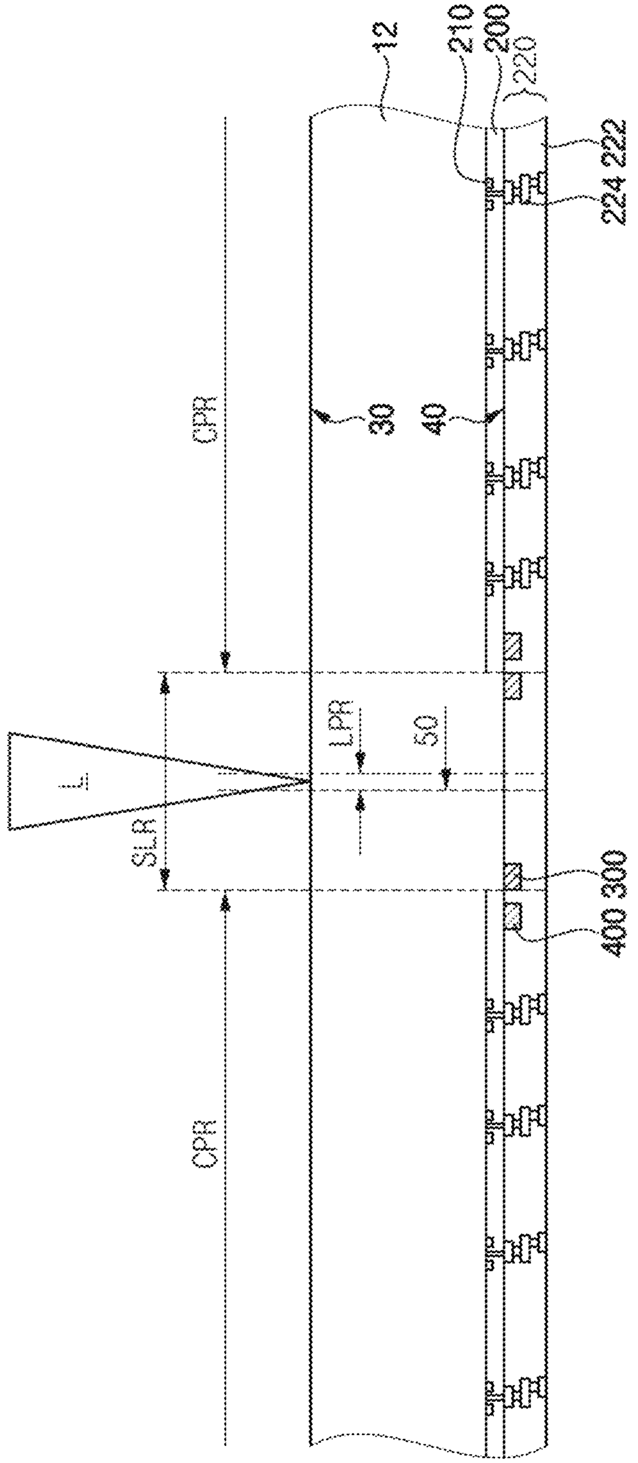

FIG. 9 is a cross-sectional view taken along the line F-F' in FIG. 8.

Referring to FIG. 9, the silicon substrate 12 may be cut using the laser L along the scribe lane region SLR.

In some example embodiments, the silicon substrate 12 may be individualized into a plurality of semiconductor chips 20 by a dicing process using the laser. In the dicing process, the laser moves along the scribe lane region SLR and may cut the silicon substrate 12. While the laser cuts the silicon substrate 12, a scattered beam SB or heat H may be generated. The scattered beam SB and heat H may cause defects in the circuit patterns 210.

In some example embodiments, the laser may include a conventional laser, a stealth laser, etc. The stealth laser may form a modified layer by concentrating light inside the semiconductor device 10. An external force may be applied to the semiconductor device 10 on which the modified layer is formed, and the modified layer of the semiconductor device 10 may be separated by the external force. The semiconductor device 10 may be separated into a plurality of semiconductor chips 20 along the modified layer.

Figure 10:
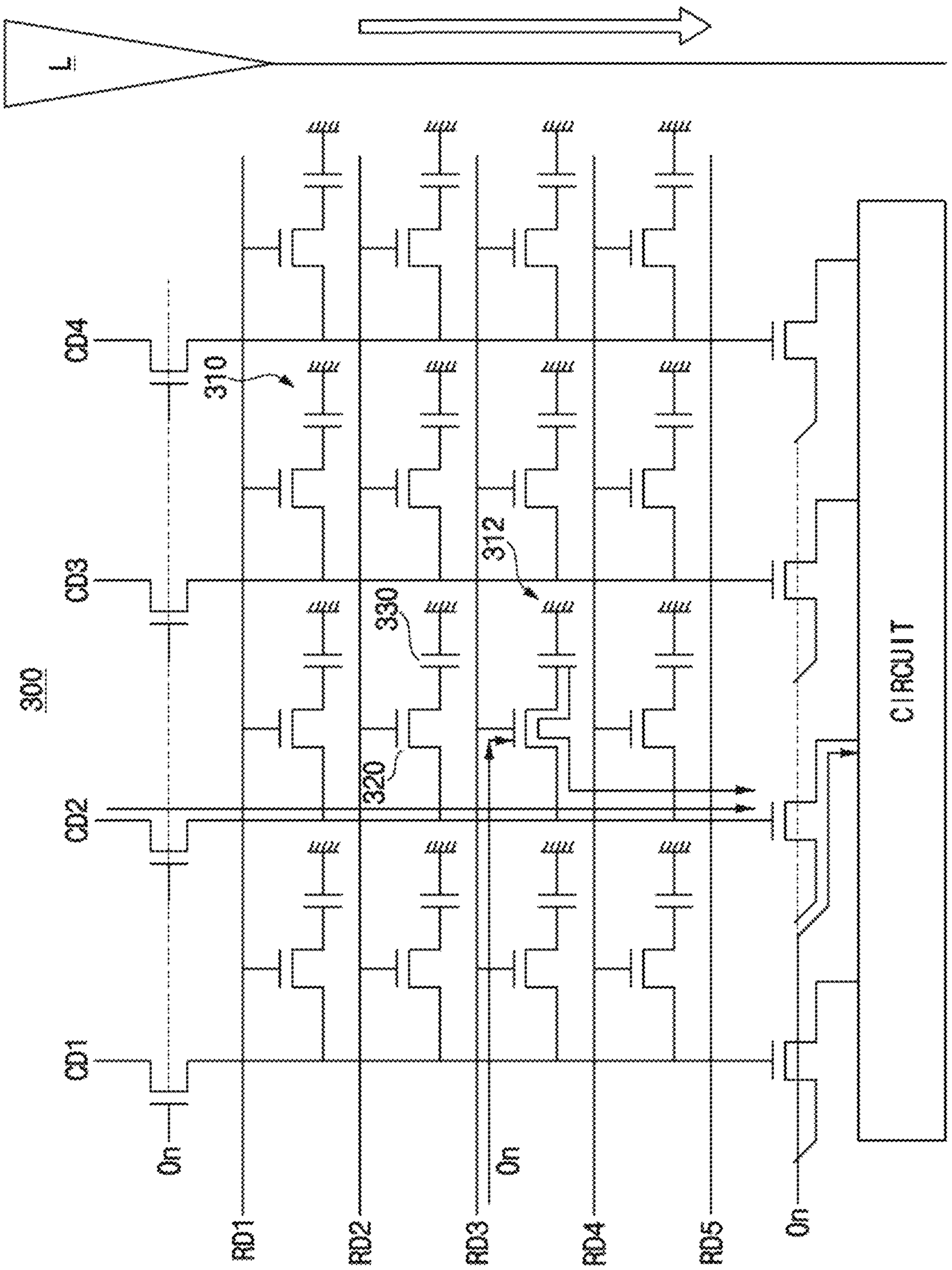
Figure 11:
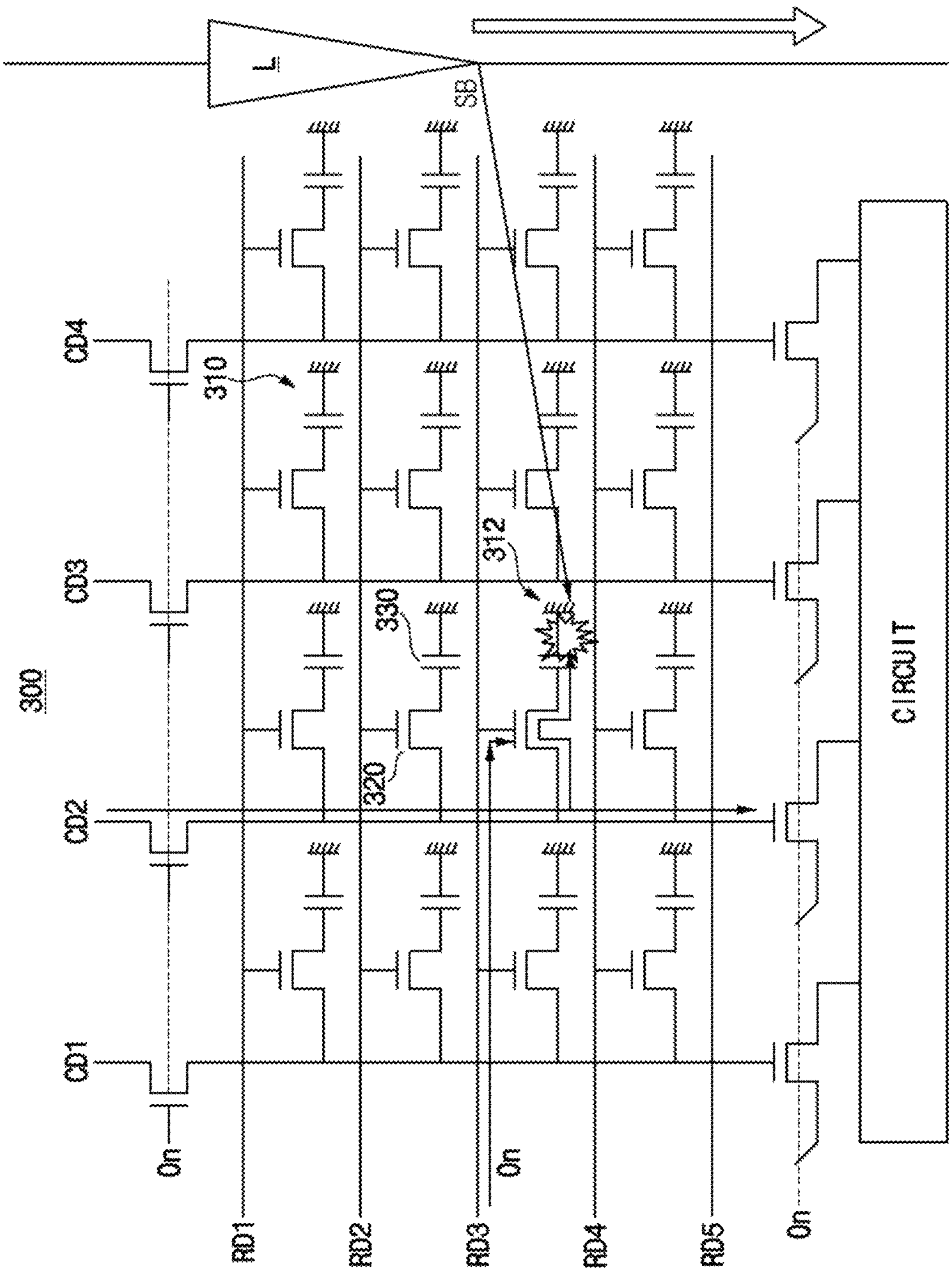
Figure 12:
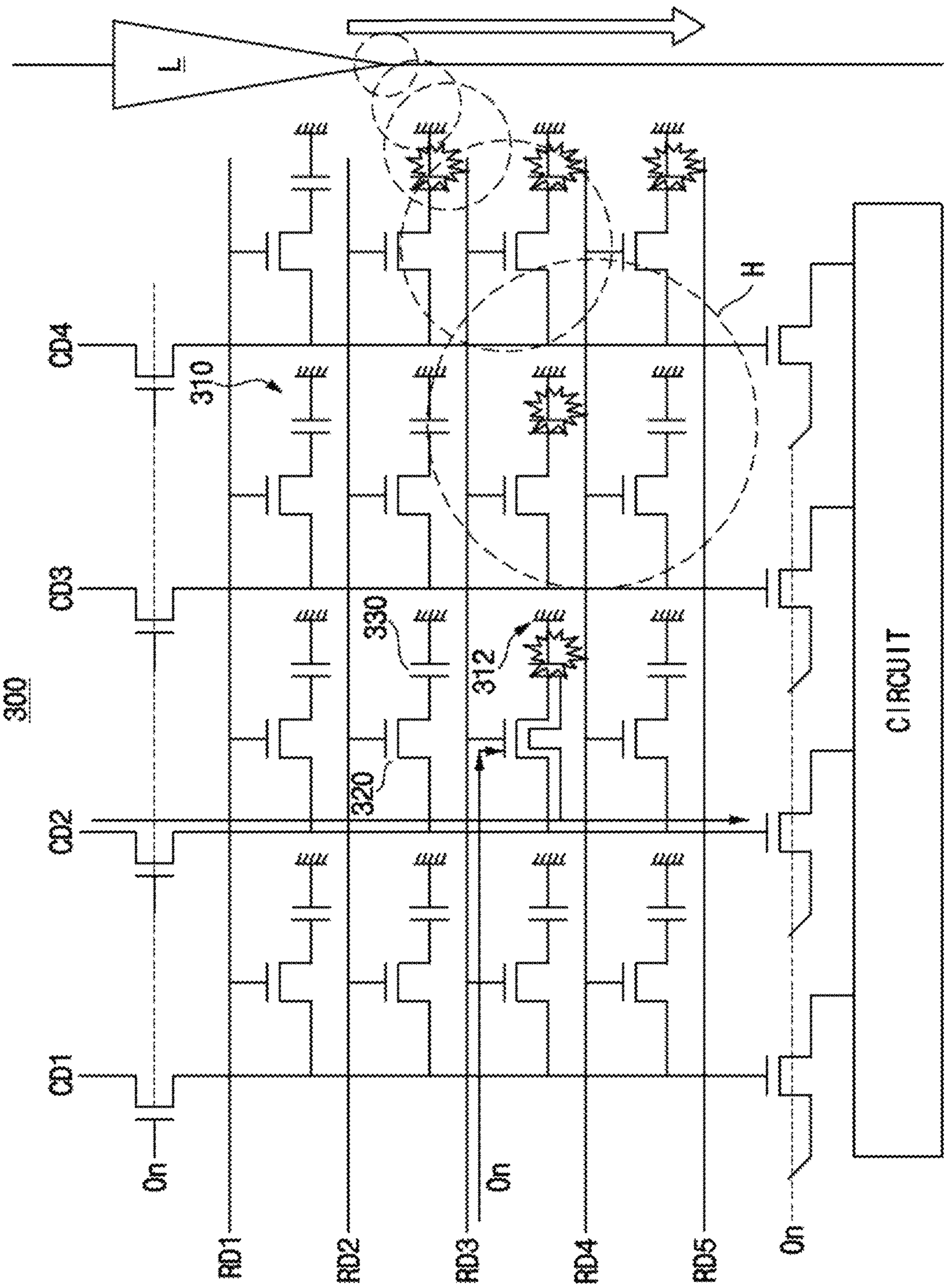

Referring to FIGS. 10 to 12, laser scattering data may be obtained from the plurality of scattering detection patterns 300 that generate leakage current by the scattered beam SB or heat H generated by the laser L, and the laser scattering data may be stored. In some example embodiments, a controller (not shown) may obtain the laser scattering data and may store the laser scattering data in a storage unit (not shown).

In some example embodiments, the plurality of circuit cells 310 of the scattering detection patterns 300 may be deformed by the scattering beam SB or heat H of the laser L. The circuit cell 312 deformed by scattered beam SB or heat H may generate the leakage current. The scattering detection pattern 300 may obtain and/or provide the position coordinate of the scattered beam SB generated in the dicing process through the plurality of circuit cells 310. The scattering detection pattern 300 may detect the distribution of heat H generated in the dicing process through the plurality of circuit cells 310.

As illustrated in FIG. 10, the scattering detection pattern 300 may include a plurality of row decks RD1, RD2, RD3, RD4, RD5 extending parallel to each other in a first horizontal direction, and a plurality of codecs (Co Dec) CD1, CD2, CD3, CD4, CD5 extending parallel to each other in a second horizontal direction perpendicular to the first horizontal direction.

The plurality of circuit cells 310 may include a plurality of transistors 320 and a plurality of capacitors 330. Current may be applied selectively to the plurality of row decks RD1, RD2, RD3, RD4, RD5 and the plurality of codecs CD1, CD2, CD3, CD4, CD5 to turn on/off the plurality of transistors 320. The plurality of capacitors 330 may be charged to a preset voltage. In some example embodiments, a controller (not shown) may control the providing of the current to turn on/off the plurality of transistors 320.

When the plurality of transistors 320 are independently turned on while the plurality of capacitors 330 are charged, the plurality of circuit cells 310 may generate a first potential difference. For example, when ½ VDD is applied to the second codec CD2 and the transistor 320 of the circuit cell 312 is turned on through the third row deck RD3, the scattering detection pattern 300 may output ½ VDD.

As illustrated in FIG. 11, the circuit cell 312 may be deformed by the scattered beam SB. For example, the laser may include the stealth laser. Leakage may occur on the capacitor 330 of the deformed circuit cell 312 due to the scattered beam SB.

As illustrated in FIG. 12, deformation due to heat H may occur on the deformable circuit cell 312. For example, the laser may include the conventional laser. Heat H may cause leakage on the capacitor 330 of the deformed circuit cell 312.

When the plurality of transistors 320 are independently turned on while the plurality of capacitors 330 are charged, the deformed circuit cell 312 in which the leakage occurs may generate a second potential difference. The second potential difference may be different from the first potential difference. For example, when ½ VDD is applied to the second codec CD2 and the transistor 320 of the deformed circuit cell 312 is turned on through the third row deck RD3, the scattering detection pattern 300 may not output ½ VDD.

In some example embodiments, the scattering detection pattern 300 may have or indicate a coordinate value of the deformed circuit cell 312 where the leakage occurs. Laser scattering occurring from the laser L may be measured through the coordinate value. The laser scattering may be stored as data during a function test. In some example embodiments, a controller (not shown) may store data indicative of the laser scattering in a storage unit (not shown) during a function test.

Through the data of the laser scattering, the degree of laser scattering of the semiconductor equipment for performing the dicing process can be confirmed. Through the degree of laser scattering, a warning control system for the semiconductor facility may be installed and quality degradation resulting from the laser scattering may be limited and/or prevented.

One or more of the elements disclosed above, such as for example the controller, may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, an application-specific integrated circuit (ASIC), etc.

The foregoing is illustrative of example embodiments and is not to be construed as limiting thereof. Although some example embodiments have been described, those skilled in the art will readily appreciate that many modifications are possible in example embodiments without materially departing from the novel teachings and advantages of the inventive concepts. Accordingly, all such modifications are intended to be included within the scope of example embodiments as defined in the claims.

What is claimed is:

1. A semiconductor chip, comprising:

a semiconductor substrate having a first surface and a second surface opposite to the first surface, the semiconductor substrate including a circuit pattern region and a peripheral region surrounding the circuit pattern region;

an activation layer on the second surface of the semiconductor substrate, the activation layer having a plurality of circuit patterns in the circuit pattern region; and at least one scattering detection pattern in the peripheral region, the at least one scattering detection pattern having a plurality of circuit cells configured to generate a leakage current based on a scattered beam or heat of a laser.

2. The semiconductor chip of claim 1, wherein a width of the peripheral region is within a range of 30 μm to 40 μm from an outer side surface of the semiconductor substrate.

3. The semiconductor chip of claim 1, wherein the peripheral region includes a scribe lane region through which the laser moves during a semiconductor manufacturing process.

4. The semiconductor chip of claim 1, wherein the at least one scattering detection pattern is adjacent to an outer side surface of the semiconductor substrate.

5. The semiconductor chip of claim 1, wherein the peripheral region includes chamfered regions, and the at least one scattering detection pattern is in at least one of the chamfered regions.

6. The semiconductor chip of claim 1, wherein the plurality of circuit patterns include decoupling capacitors, the semiconductor chip further comprising:

at least one second scattering detection pattern adjacent to a decoupling capacitor from among the decoupling capacitors in the circuit pattern region, the at least one second scattering detection pattern having a plurality of second circuit cells configured to generate a second leakage current based on the scattered beam or the heat.

7. The semiconductor chip of claim 1, wherein the plurality of circuit cells include a plurality of transistors and a plurality of capacitors.

8. The semiconductor chip of claim 7, wherein when the plurality of transistors are independently turned on while the plurality of capacitors are charged, the plurality of circuit cells are configured to generate a first potential difference, and a circuit cell from among the plurality of circuit cells that generates the leakage current based on the scattered beam or the heat of the laser is configured to generate a second potential difference different from the first potential difference.

9. The semiconductor chip of claim 1, wherein the plurality of circuit cells are arranged in a grid shape.

10. The semiconductor chip of claim 1, wherein the laser comprises a stealth laser or a conventional laser.

11. A semiconductor device, comprising:

a silicon substrate having a first surface and a second surface opposite to the first surface, the silicon substrate including a plurality of circuit pattern regions and a peripheral region between the plurality of circuit pattern regions;

an activation layer on the second surface of the silicon substrate, the activation layer having a plurality of circuit patterns respectively in the plurality of circuit pattern regions; and a plurality of scattering detection patterns in the peripheral region, each of the plurality of scattering detection patterns having a plurality of circuit cells configured to generate a leakage current based on a scattered beam or heat of a laser.

12. The semiconductor device of claim 11, wherein the peripheral region includes a scribe lane region through which the laser moves during a semiconductor manufacturing process.

13. The semiconductor device of claim 12, wherein the plurality of scattering detection patterns are adjacent to a laser pass region within the scribe lane region.

14. The semiconductor device of claim 11, wherein the peripheral region includes a plurality of chamfer regions adjacent to corners of each of the plurality of circuit pattern regions, and the plurality of scattering detection patterns are in the plurality of chamfer regions.

15. The semiconductor device of claim 11, further comprising:

at least one second scattering detection pattern in the plurality of circuit pattern regions, the at least one second scattering detection pattern having a plurality of second circuit cells that generate a second leakage current based on the scattered beam or the heat of the laser.

16. The semiconductor device of claim 11, wherein the plurality of circuit cells include a plurality of transistors and a plurality of capacitors.

17. The semiconductor device of claim 16, wherein when the plurality of transistors are independently turned on while the plurality of capacitors are charged, the plurality of circuit cells are configured to generate a first potential difference, and a circuit cell from among the plurality of circuit cells that generates the leakage current based on the scattered beam or the heat of the laser is configured to generate a second potential difference different from the first potential difference.

18. The semiconductor device of claim 11, wherein the plurality of circuit cells are arranged in a grid shape.

19. The semiconductor device of claim 11, wherein the laser comprises a stealth laser or a conventional laser.

20. A semiconductor chip, comprising:

a semiconductor substrate having a first surface and a second surface opposite to the first surface, the semiconductor substrate including a circuit pattern region and a peripheral region surrounding the circuit pattern region;

an activation layer on the second surface of the semiconductor substrate, the activation layer having a plurality of circuit patterns in the circuit pattern region; and at least one scattering detection pattern in the peripheral region, the at least one scattering detection pattern having a plurality of circuit cells configured to generate leakage current based on a scattered beam or heat of a laser, wherein the plurality of circuit cells are arranged in a grid shape, and wherein each circuit cell of the plurality of circuit cells includes a transistor and a capacitor.

* * * * *